United States Patent
Spijker

(10) Patent No.: US 12,015,414 B2
(45) Date of Patent: Jun. 18, 2024

(54) DUAL DIGITAL PHASE LOCK LOOP WITH UNMODULATION COUPLING

(71) Applicant: RENESAS ELECTRONICS AMERICA INC., Milpitas, CA (US)

(72) Inventor: Menno Tjeerd Spijker, Richmond Hill (CA)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 75 days.

(21) Appl. No.: 17/961,741

(22) Filed: Oct. 7, 2022

(65) Prior Publication Data

US 2024/0120924 A1 Apr. 11, 2024

(51) Int. Cl.
| H03L 7/07 | (2006.01) |
| H03L 7/107 | (2006.01) |
| H03L 7/23 | (2006.01) |
| H04L 7/033 | (2006.01) |

(52) U.S. Cl.
CPC .............. *H03L 7/07* (2013.01); *H03L 7/1075* (2013.01); *H03L 7/23* (2013.01); *H04L 7/0337* (2013.01)

(58) Field of Classification Search
CPC . H03L 7/07; H03L 7/1075; H03L 7/23; H04L 7/0337
See application file for complete search history.

(56) References Cited

U.S. PATENT DOCUMENTS

| 7,368,962 B2 * | 5/2008 | Nakamuta | H03L 7/104 327/147 |
| 8,461,885 B2 * | 6/2013 | Nguyen | H03L 7/23 327/147 |
| 10,666,269 B2 * | 5/2020 | Spijker | H03L 7/07 |
| 2003/0063701 A1 * | 4/2003 | Eubanks | H03L 7/0994 375/376 |
| 2019/0288695 A1 * | 9/2019 | Yao | H03L 7/235 |

* cited by examiner

*Primary Examiner* — Dac V Ha
(74) *Attorney, Agent, or Firm* — SCULLY, SCOTT, MURPHY & PRESSER, P.C.

(57) ABSTRACT

Semiconductor devices for synchronizing networks are described. A semiconductor device can include an analog phase-lock loop (APLL) configured to output a first signal. The semiconductor device can further include a first digital phase-lock loop (DPLL) configured to output a second signal. The semiconductor device can further include a second DPLL configured to output a third signal. A combination of the first signal and the second signal can be used to generate a first output clock signal. A difference resulting from a subtraction of the second signal from the third signal can be used to generate a second output clock signal.

20 Claims, 4 Drawing Sheets

DUAL DIGITAL PHASE LOCK LOOP WITH UNMODULATION COUPLING

BACKGROUND OF THE SPECIFICATION

The present disclosure relates in general to semiconductor devices and, more particularly, to timing circuits that can implement an unmodulation coupling of dual digital phase-locked loops.

A timing circuit including transceivers and clock circuits can be connected to multiple networks to synchronize the multiple networks. The timing circuit can include multiple phase-locked loops, such as analog phase-locked loops (APLL) and digital phase-locked loops (DPLL). An APLL can include an analog phase detector, charge pump, loop filter, and voltage-controlled oscillator (VCO) in a feedback loop. A DPLL can include a digital phase detector and loop filter, and a digital controlled oscillator (DCO). Digital phase-locked loops are typically smaller than analog PLLs, due to the inclusion of digital phase detector & loop filter. A combination of APLL and DPLL can form a mixed signal phase-locked loop that reduces jitter in signals being outputted by the timing circuit.

SUMMARY

In one embodiment, a semiconductor device for synchronizing networks is generally described. The semiconductor device can include an analog phase-lock loop (APLL) configured to output a first signal. The semiconductor device can further include a first digital phase-lock loop (DPLL) configured to output a second signal. The semiconductor device can further include a second DPLL configured to output a third signal. A combination of the first signal and the second signal can be used to generate a first output clock signal. A difference resulting from a subtraction of the second signal from the third signal can be used to generate a second output clock signal.

In one embodiment, an apparatus for synchronizing networks is generally described. The apparatus can include a plurality of transceivers and a timing circuit. The timing circuit can be configured to receive a first reference signal from a first transceiver among the plurality of transceivers. The timing circuit can be further configured to receive a second reference signal from a second transceiver among the plurality of transceivers. The timing circuit can be further configured to output a first output clock signal to a second transceiver among the plurality of transceivers. The timing circuit can be further configured to output a second output clock signal to a second clock circuit among the plurality of clock circuits. The first output clock signal can be based on a combination of a first signal generate by an analog phase-lock loop (APLL) and a second signal generated by a digital phase-lock loop (DPLL) in the timing circuit. The second output clock signal can be based on a difference resulting from a subtraction of the second signal from a third signal generates by a second DPLL of the timing circuit.

In one embodiment, a method for operating a timing circuit to synchronize a plurality of networks. The method can include operating an analog phase-lock loop (APLL) to output a first signal. The method can further include operating a first digital phase-lock loop (DPLL) to output a second signal. The method can further include operating a second DPLL to output a third signal. The method can further include combining the first signal and the second signal to generate a first output clock signal. The method can further include subtracting the second signal from the third signal to generate a second output clock signal. The second output clock signal can be independent from operations of the first DPLL.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
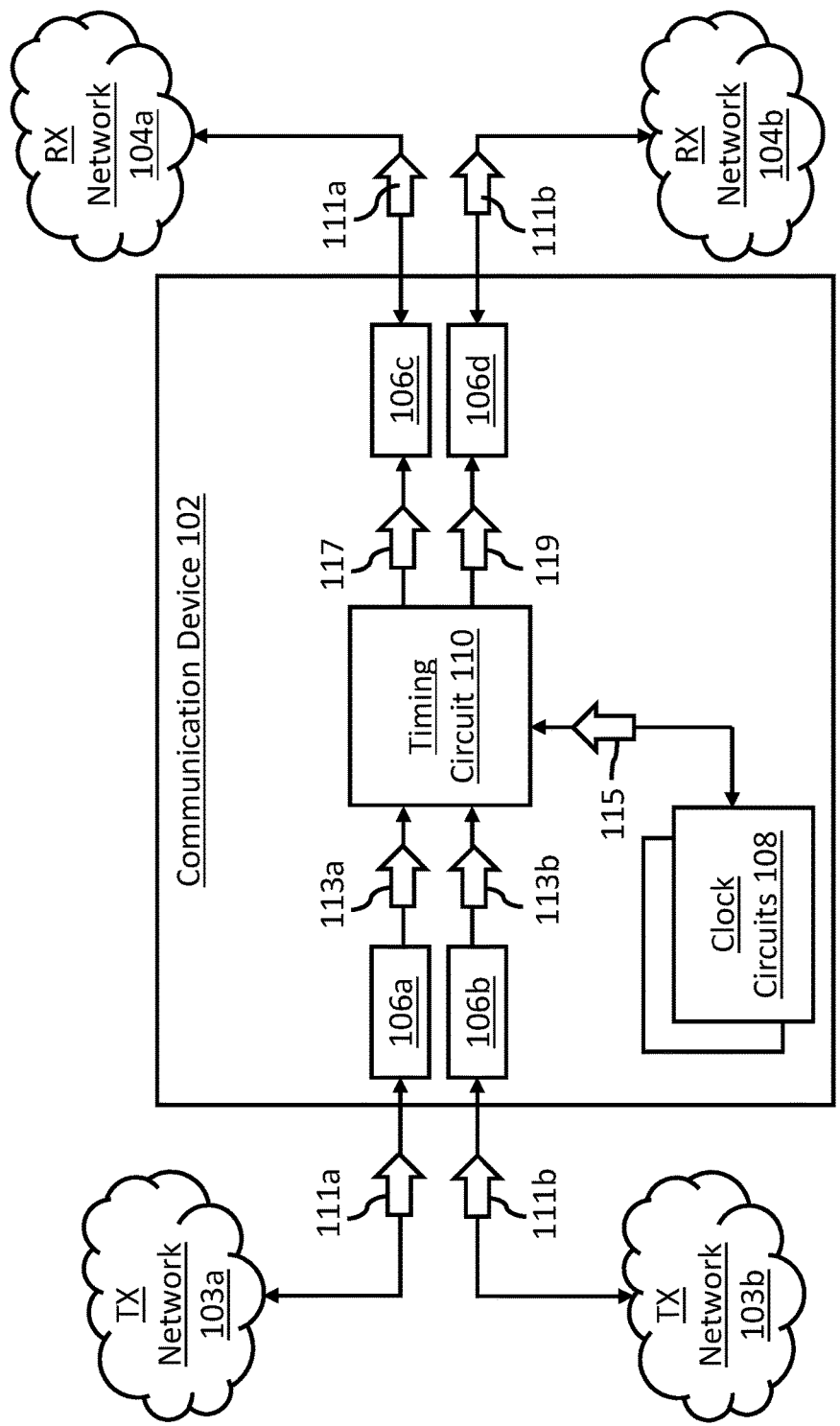
FIG. 1 is a block diagram of an example system for dual digital phase lock loop with unmodulation coupling in one embodiment.

FIG. 1 is a block diagram of an example system for dual digital phase lock loop with unmodulation coupling in one embodiment. System 100 can include a communication device 102 and a plurality of networks, such as networks 103a, 103b, 104a, 104b. In one embodiment, communication device 102 can be implemented in as a telecommunications network circuit. Examples of telecommunications network circuit can include, but not limited to, a switch (e.g., Synchronous Ethernet, or SyncE, switch) and a router. In one embodiment, system 100 can be implemented to synchronize multiple networks (e.g., two or more networks), such as networks 103a, 103b, 104a, 104b. Networks 103a, 103b, 104a, 104b can be, for example, local area networks (LANs), time division multiplexing (TDM) based networks such as SONET/SDH/PDH, and/or Ethernet-based packet networks.

Communication device 102 can include one or more transceivers 106a, 106b. In one embodiment, transceivers 106a, 106b, 106c, 106 can be Ethernet physical layer transceiver chips. Transceivers 106a, 106b, 106c, 106d can be configured to send or receive data to or from networks 103a, 103b, 104a, 104b, clock circuits 108, and/or timing circuit 110. Communication device 102 can further include at least one clock circuit 108. In one embodiment, clock circuit 108 can be a precision timing protocol (PTP) timing circuit. Communication device 102 can further include a timing circuit 110. In one embodiment, timing circuit 110 can be a network card. Although the example in FIG. 1 shows four networks, four transceivers, and one clock circuit, but communication device 102 can include arbitrary number of networks, transceivers, and clock circuits.

In one embodiment, transceivers 106a, 106b, 106c, 106d, clock circuit 108, and timing circuit 110 can be deployed throughout a telecommunications network, in a server rack, or other types of communication devices and networks. In one embodiment, system 100 can be implemented as a single semiconductor integrated circuit (or semiconductor package or device). In another embodiment, transceivers 106a, 106b, 106c, 106d, clock circuit 108, and timing circuit 110, can be implemented as individual semiconductor IC on a printed circuit board.

Transceiver 106a can be coupled to network 103a, and can be configured to send and/or receive signals to and/or from network 103a. Transceiver 106a can be further configured to communicate signals to and from clock circuit 108 and timing circuit 110. Transceiver 106b can be coupled to network 103b, and can be configured to send and/or receive signals to and/or from network 103b. Transceiver 106b can be further configured to communicate signals to and from clock circuit 108 and timing circuit 110. Transceiver 106c can be coupled to network 104a, and can be configured to send and/or receive signals to and/or from network 104a. Transceiver 106c can be further configured to communicate signals to and from clock circuit 108 and timing circuit 110. Transceiver 106d can be coupled to network 104b, and can be configured to send and/or receive signals to and/or from network 104b. Transceiver 106d can be further configured to communicate signals to and from clock circuit 108 and timing circuit 110.

In one embodiment, clock circuit 108 can implement IEEE 1588 compliant packet based timing scheme. Each one of the at least one clock circuit 108 can be configured as a master clock or a slave clock. Clock circuit 108, when implemented as a master clock, can send sync messages to other clock circuits that are being implemented as a slave clock.

In one embodiment, networks 103a,103b can be transmitting networks and networks 104a, 104b can be receiving networks such that data 111a, 111b can be transmitted from networks 103a, 103b to networks 1104a, 104b via communication device 102, respectively. When networks 103a, 103b are transmitting networks, transceivers 106a, 106b can recover respective physical reference clock signals 113a, 113b from data 111a, 111b, respectively. In one embodiment, recovered physical reference clock signals 113a, 113b can be SyncE physical clock signals. Transceivers 106a, 106b can send recovered physical reference clock signals 113a, 113b to timing circuit 110. Clock circuit 108, when implemented as a slave clock, can send a reference signal 115 to timing circuit 110. Reference signal 115 can be an internal reference clock, such as a PTP phase clock signal. Timing circuit 110 can generate an output clock signal 117 that is frequency and/or phase locked with physical reference clock signal 113a, and an output clock signal 119 that is frequency and/or phase-locked with physical reference clock signal 113b. Timing circuit 110 can send output clock signals 117, 119 to transceiver 106b and clock circuit 108b, respectively, such that timing circuit 110 can send data 111a, 111b to networks 104a, 104b under synchronized frequency and phase. In one embodiment, timing circuit 110 can also generate output clock signals that is frequency and/or phase locked with reference signal 115.

Timing circuit 110 can include multiple analog phase-locked loops (APLL) and digital phased-lock loops (DPLL) configured to generate frequency locked and/or phase locked signals. A combination of analog phase-locked loop (APLL) and digital phased-lock loop (DPLL) can form a mixed signal phase-locked loop (PLL) that reduces jitter at the output of timing circuit 110. In an aspect, multiple APLL-DPLL combinations can be implemented in a timing circuit, but APLLs can be larger than DPLLs, thus multiple APLLs can occupy relatively large circuit board area and increase device size. Further, additional APLLs can lead to an increase in inductive coupling between multiple VCOs, thus degrading jitter performance. Some implementations can include having a single APLL coupled to multiple DPLLs to reduce device size, but these implementations utilize fractional output dividers (FOD) to divide high frequency clocks generated by multiplying the APLL output with outputs from multiple DPLLs, and the FOD does not reduce jitter as well as an APLL implemented with an integer output divider.

Further, some implementations utilize a first DPLL to control an APLL, and a second DPLL coupled to a FOD to generate feedback and output clock. The first DPLL can provide an output clock of relatively lower jitter while the second DPLL can provide an output clock of relatively higher. Since the clock for the FOD comes from the APLL and the APLL is controlled by the first DPLL, the output clock from the second DPLL is controlled by both DPLLs. If the bandwidth of the first DPLL is significantly lower than the bandwidth of the second DPLL, then the modulation signal from the first DPLL on the APLL can be suppressed by the second DPLL. However, this implementation restricts the bandwidth of the first DPLL to be significantly less than the bandwidth of the second DPLL.

Timing circuit 110 described herein can include a first DPLL to control an APLL, and a second DPLL coupled to a FOD to generate feedback and output clock. A modulation from the first DPLL, that is being applied on the APLL, can be subtracted from an output or the second DPLL, such that the modulation from the first DPLL can be suppressed regardless of whether the bandwidths of the first and second DPLLs are the same or significantly different. Hence, timing circuit 110 can be implemented for applications where bandwidths for multiple DPLLs are similar (e.g., identical or approximately identical). Further, the similar bandwidths can reduce inductive coupling between different DPLLs in timing circuit 110. Some example applications of timing circuit 110 described herein can include, but not limited to, networks or wireless base stations that operate with independent clock, or SynE clock signals that needs to be kept separated.

Figure 2:
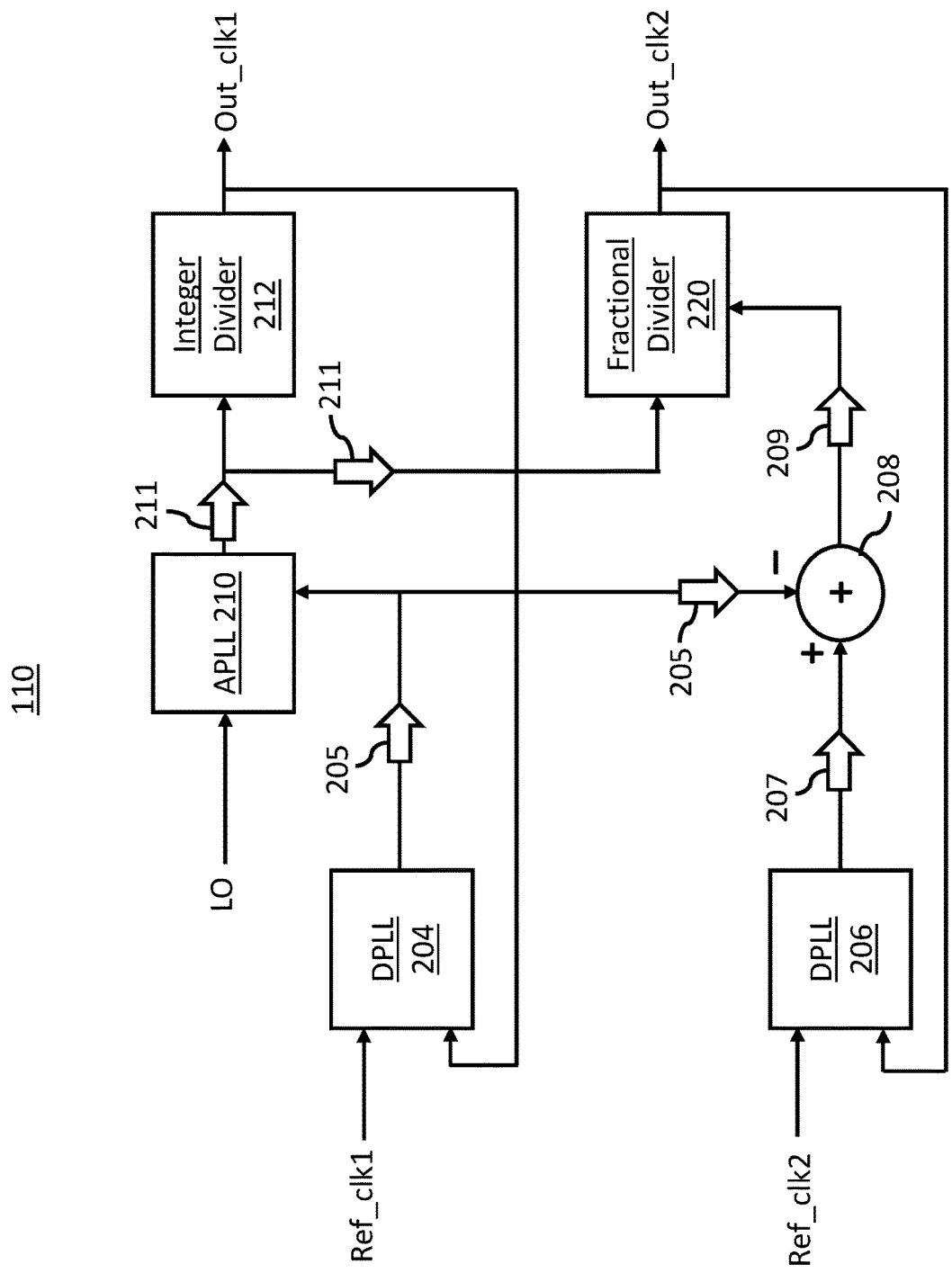
FIG. 2 is a block diagram illustrating details of a timing circuit in one embodiment.

FIG. 2 is a block diagram illustrating details of a timing circuit in one embodiment. Details of timing circuit 110 (also shown in FIG. 1) are shown in FIG. 2. Timing circuit 110 can include a digital phase lock loop (DPLL) 204, a DPLL 206, an integer divider 212, an analog phase lock loop (APLL) 210, and a fractional output divider (FOD) 220. In one embodiment, DPLL 204 and DPLL 206 can include identical components.

DPLL 204 can receive a first reference signal Ref_clk1 and use Ref_clk1 to synchronize an output signal Out_clk1 of integer divider 212. DPLL 204 can include a feedback loop that compares output signal 205 with Ref_clk1 to determine differences (e.g., phase, amplitude, frequency difference) between output signal 205 and Ref_clk1, and the difference can be filtered by DPLL 204 to remove any undesired frequencies. The filtered difference based on feedback of output signal 205, from DPLL 204, can be applied to a frequency setting of the APLL 210, such that the VCO of APLL 210 can produce output signal 211 that is frequency and/or phase locked with Ref_clk1.

DPLL 206 can function in a similar manner as DPLL 204, where DPLL 206 can receive a second reference signal Ref_clk2 and use Ref_clk2 to synchronize an output signal Out_clk2 of FOD 220. Output signal Out_clk2 can be frequency and/or phase locked with Ref_clk2. Referring to the example in FIG. 1, Ref_clk1 can be physical reference clock signal 113*a* and Ref_clk2 can be physical reference clock signal 113*b*. In one or more embodiments, one of Ref_clk1 and Ref_clk 2 can be reference signal 115 shown in FIG. 1. APLL 210 can include different components from DPLLs 204, 206, but can function similarly. For example, APLL 210 can receive a local oscillator signal (LO) as a reference input signal and use LO to synchronize an output signal 211 of APLL 210.

In one embodiment, output signals 205 and output signal 207 (from DPLL 206) can be multi-bit digital data signals that represent a fractional frequency offset to steer APLL 210 and/or FOD 220. Output signal 205 can be distributed to APLL 210 and subtraction node 208. In one embodiment, APLL 210 can use output signal 205 as a modulation signal to modulate an output of a VCO in APLL 210 in order to generate a clock signal 211. APLL 210 can send clock signal 211 to integer divider 212, and integer divider 212 can divide clock signal 211 to generate an output clock signal Out_clk1. Out_clk1 can be locked (e.g., in frequency and/or phase) with reference signal Ref_clk1 received by DPLL 204. Clock signal 211 can also be divided by fractional divider 220 to generate output clock signal Out_clk2.

At subtraction node 208, output signal 205 can be subtracted from output signal 207 from DPLL 206. Subtraction node 208 can output a difference signal 209 to fractional output divider 220, where difference signal 209 can be a difference between output signals 205, 207. In one embodiment, difference signal 209 can be a multi-bit digital data signal that represent a fractional frequency offset to steer FOD 220. Fractional output divider 220 can be configured to divide clock signal 211 by a non-integer divide ratio. The subtraction at subtraction node 208 can cause output signal 205 to be unmodulated or canceled out from clock signal 211 in output clock signal Out_clk2. For example, if output signal 205 indicates a frequency offset for increasing an output frequency of APLL 210 by 10 parts per million (ppm), and output signal 207 indicates a frequency offset of 3 ppm, then difference signal 209 can indicate a frequency offset of −7 ppm. Clock signal 211 can have an offset of 10 ppm and the output frequency of fractional output divider 220 can be pushed down by 10 ppm due to difference signal 209 and a net result of the output frequency of fractional output divider 220 can be 3 ppm (e.g., same as output signal 207).

As a result of canceling output signal 205 in fractional output divider 220, an output clock signal Out_clk2 outputted from fractional output divider 220 can be locked (e.g., in frequency and/or phase) with reference signal Ref_clk2. Referring to the example in FIG. 1, Out_clk1 can be output clock signal 117 and Out_clk2 can be output clock signal 119. Further, by canceling output signal 205, Out_clk1 and Out_clk2 can be independent from one another. For example, Out_clk2 may no longer be dependent on Ref_clk1. Hence, Out_clk1 can be locked to Ref_clk and Out_clk2 can be locked to Ref_clk2. Since Out_clk1 and Out_clk2 are independent from one another, DPLL 204 and DPLL 206 can operate under similar bandwidth without a need to implement additional hardware to suppress modulation signal (e.g., output signal 205) being provided from DPLL 204 to APLL 210. Also, bandwidths of DPLL 204 and DPLL 206 can be adjusted with flexibility without the restriction of designing timing circuit 110 to have DPLLs of different bandwidths. Furthermore, timing circuit 110 can be implemented for dual DPLLs with similar or different bandwidths.

Figure 3:
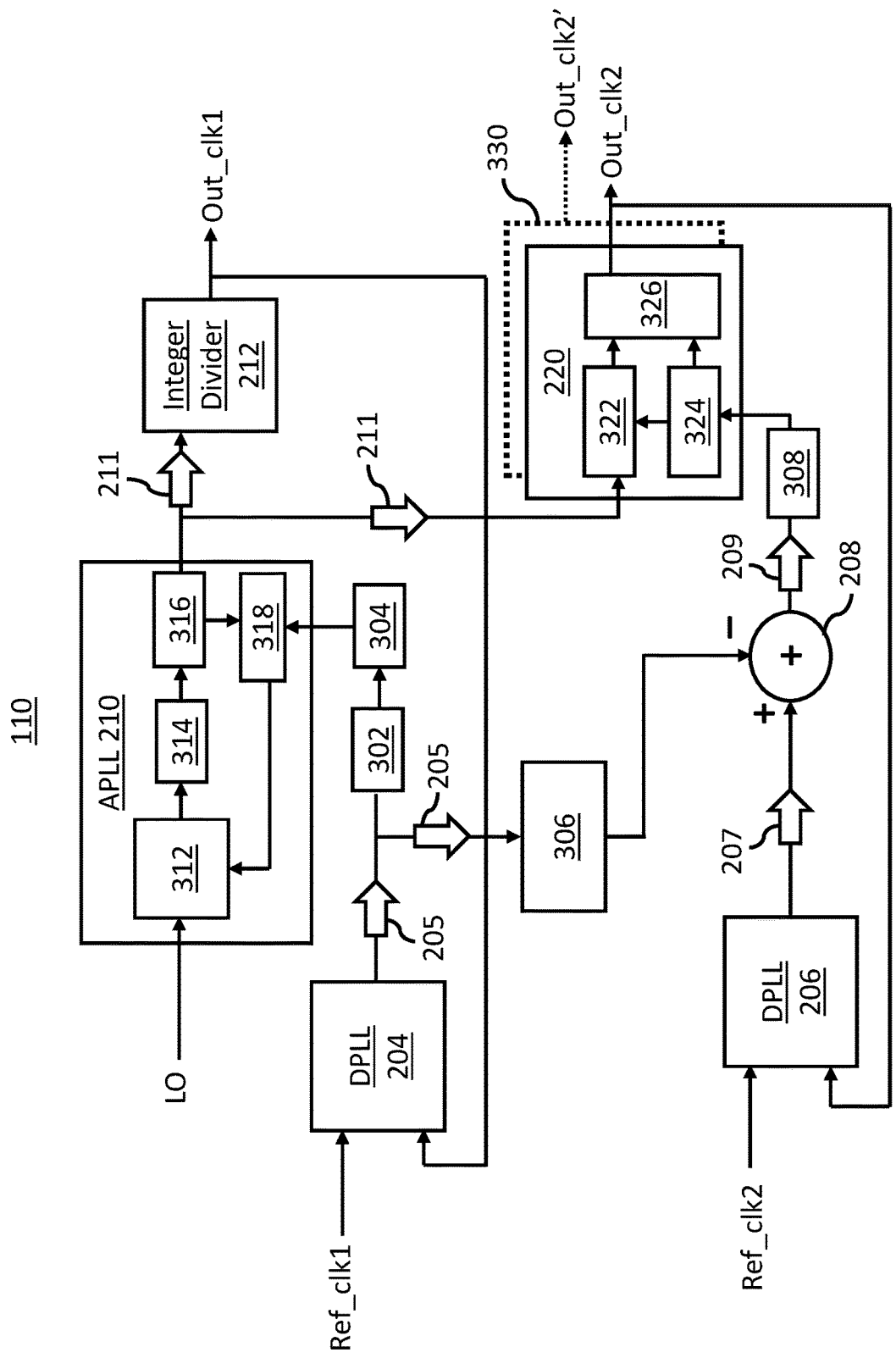
FIG. 3 is a block diagram illustrating additional details of the timing circuit of FIG. 2 in one embodiment.

FIG. 3 is a block diagram illustrating additional details of the timing circuit of FIG. 2 in one embodiment. In one embodiment shown in FIG. 3, timing circuit 110 can further include a scaler 302 and a sigma delta modulator (SDM) 304 connected between DPLL 204 and APLL 210. Timing circuit 110 can further include a scaler 308 connected between an output of subtraction node 208 and fractional output divider 220. In one embodiment, timing circuit 110 can further include a digital low pass filter (LPF) 306 connected between DPLL 204 and subtraction node 208. APLL 210 can include a circuit block 312, a low pass filter 314, a VCO 316, and a multi-modulus divider (MMD) 318. Circuit block 312 can include a phase and frequency detector and a charge pump. Fractional output divider 220 can include an MMD 322, an SDM 324, and a jitter reduction circuit 326. In one embodiment, implementing fractional output divider 220 that includes MMD 322, SDM 324 and jitter reduction circuit, can allow APLL 210 to be implemented using an LC-based APLL.

Scaler 302 can upscale or downscale output signal 205, and the scaled version of output signal 205 can be inputted to SDM 304. SDM 304 can convert the scaled version of output signal 205 into, for example, a lower bit-count and higher-frequency digital signal. The converted output signal 205 from SDM 304 can be provided to MMD 318 of APLL 210. MMD 318 can be controlled by output signal 205 and MMD 318 can perform a division on the output clock signal 211. The divided clock signal can be provided from MMD 318 to circuit block 312. Circuit block 312 can determine a phase and frequency difference the between the divided clock signal from MMD 318 and LO clock signal. The difference can be passed through LPF 314 then into VCO for adjusting and/or generating output signal 211.

Scaler 308 can upscale or downscale difference signal 209, and the scaled version of difference signal 209 can be inputted to SDM 324. SDM 324 can convert the scaled version of difference signal 209 into, for example, a lower bit-count and higher-frequency digital signal. The scaled version of difference signal 209 from SDM 308 can be provided to MMD 322 of FOD 220. MMD 322 can be controlled by the scaled version of difference signal 209 and MMD 322, receive clock signal 211 from APLL 210, and perform a division on clock signal 211. The results from MMD 322 and SDM 324 can be provided to jitter reduction circuit 326 to reduce jitter of Out_clk2 signal.

In one embodiment, a first signal path can be the path from the output of DPLL 204 to fractional output divider 220 via subtraction node 208, and a second signal path can be a path from DPLL 204 to fractional output divider 220 via APLL 210. LPF 306 can be situated between the output of DPLL 204 and subtraction node 208 to slow down the first signal path (e.g., by filtering output signal 205) in order to balance the timing in which signals are being inputted to fractional output divider 220 via first and second paths. For example, if current flows in the first signal path relatively faster than the second signal path, LPF 306 can show down the first signal path.

The first signal path and the second signal path can have different speeds based on the bandwidths of DPLL 204 and APLL 210. For example, if the bandwidth of DPLL 204 is not much less than APLL 210, then LPF 306 can slow down the first signal path. In one embodiment, as a difference between the bandwidth of DPLL 204 and the bandwidth APLL 210 increases, the effect of LPF 306 may become neglectable. A bandwidth of LPF 306 can be programmable based on the bandwidth APLL 210. For example, the unmodulation or cancellation of output signal 205 described herein can be optimized by matching the bandwidth of LPF 306 with the bandwidth of APLL 210.

In one embodiment, timing circuit 110 can further include at least one additional copy of fractional output divider 220, such as a fractional output divider 330. Each one of the additional fractional output dividers can receive output signal 211 and the scaled version of difference signal 209, and output a respective copy of Out_clk2. For example, the additional fractional output divider 330 can output Out_clk2' that can be identical to Out_clk2.

Figure 4:
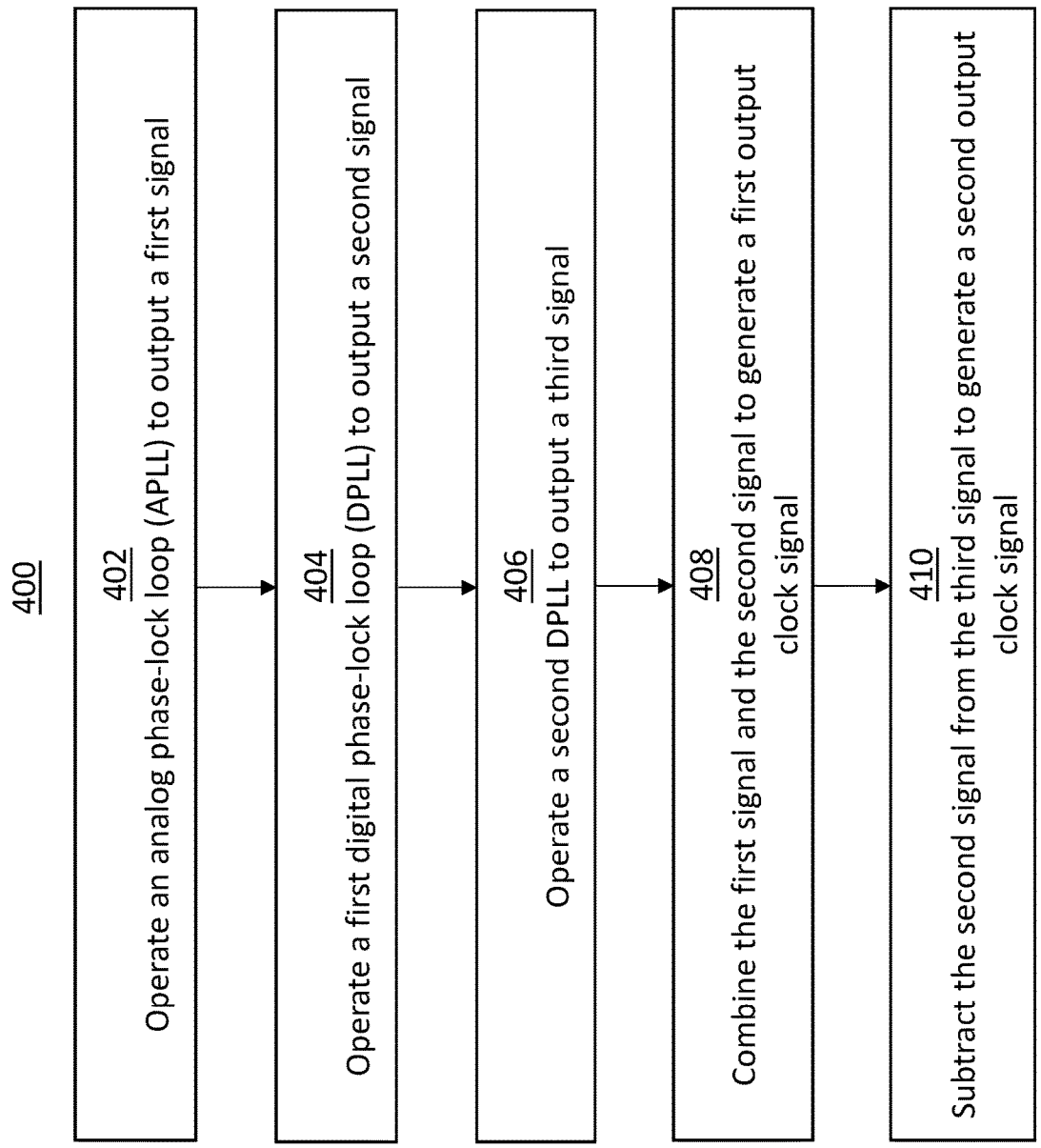
FIG. 4 is a flowchart of an example process that can implement dual digital phase lock loop with unmodulation coupling in one embodiment.

FIG. 4 is a flowchart of an example process that can implement dual digital phase lock loop with unmodulation coupling in one embodiment. Process 400 in FIG. 4 may be implemented using, for example, timing circuit 110 discussed above. An example process may include one or more operations, actions, or functions as illustrated by one or more of blocks 402, 404, 406, 408, and/or 410. Although illustrated as discrete blocks, various blocks may be divided into additional blocks, combined into fewer blocks, eliminated, performed in different order, or performed in parallel, depending on the desired implementation.

Process 400 can be performed by a timing circuit (e.g., timing circuit 110 in FIG. 1 to FIG. 3) to synchronize a plurality of networks. Process 400 can begin at block 402. At block 402, the timing circuit can operate an analog phase-lock loop (APLL) to output a first signal. Process 400 can proceed from block 402 to block 404. At block 404, the timing circuit can operate a first digital phase-lock loop (DPLL) to output a second signal. Process 400 can proceed from block 404 to block 406. At block 406, the timing circuit can operate a second DPLL to output a third signal. In one or more embodiments, block 402, 404, 406 can be performed in an arbitrary order or in parallel.

Process 400 can proceed from block 402 to block 404. At block 404, the timing circuit can combine the first signal and the second signal to generate a first output clock signal. Process 400 can proceed from block 402 to block 404. At block 404, the timing circuit can subtract the second signal from the third signal to generate a second output clock signal. The second output clock signal can be independent from operations of the first DPLL. In one or more embodiments, block 408, 410 can be performed in an arbitrary order or in parallel.

In one embodiment, the timing circuit can operate a plurality of fractional output dividers to output a plurality of copies of the second output clock signal. In one embodiment, the timing circuit can operate a low pass filter to filter the second signal prior to subtracting of the second signal from the third signal, where a bandwidth of the low pass filter is based on a bandwidth of the APLL. In one embodiment, a difference between a bandwidth of the first DPLL and a bandwidth of the second DPLL is less than a predefined threshold.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
an analog phase-lock loop (APLL) configured to output a first signal;
a first digital phase-lock loop (DPLL) configured to output a second signal; and
a second DPLL configured to output a third signal, wherein:
a combination of the first signal and the second signal is being used to generate a first output clock signal; and
a difference resulting from a subtraction of the second signal from the third signal is being used to generate a second output clock signal.

2. The semiconductor device of claim 1, further comprising:
an integer divider configured to:
receive the combination of the first signal and the second signal; and
output the first output clock signal; and
a fractional output divider configured to:
receive the difference and the combination; and
output the second output clock signal.

3. The semiconductor device of claim 1, further comprising a plurality of fractional output dividers, wherein each one of the plurality of fractional output dividers is configured to output a copy of the second output clock signal.

4. The semiconductor device of claim 1, further comprising a low pass filter configured to filter the second signal prior to the subtraction of the second signal from the third signal, where a bandwidth of the low pass filter is based on a bandwidth of the APLL.

5. The semiconductor device of claim 1, further comprising a scaler configured to scale the difference before generation of the second output clock signal.

6. The semiconductor device of claim 1, further comprising a frequency output divider, wherein frequency output divider comprises:
   a multi-modulus divider configured to receive the combination of the first signal and the second signal;
   a sigma-delta modulator configured to receive the difference combination of the first signal and the second signal; and
   a jitter reduction circuit configured to reduce jitter in the second output clock signal.

7. The semiconductor device of claim 1, wherein a difference between a bandwidth of the first DPLL and a bandwidth of the second DPLL is less than a predefined threshold.

8. The semiconductor device of claim 1, wherein the second output clock signal is independent from operations of the first DPLL.

9. An apparatus comprising:
   a plurality of transceivers;
   a timing circuit configured to:
      receive a first reference signal from a first transceiver among the plurality of transceivers;
      receive a second reference signal from a second transceiver among the plurality of transceivers;
      output a first output clock signal to a second transceiver among the plurality of transceivers; and
      output a second output clock signal to a second clock circuit among the plurality of clock circuits,
   wherein:
      the first output clock signal is based on a combination of a first signal generate by an analog phase-lock loop (APLL) and a second signal generated by a first digital phase-lock loop (DPLL) in the timing circuit; and
      the second output clock signal is based on a difference resulting from a subtraction of the second signal from a third signal generates by a second DPLL of the timing circuit.

10. The apparatus of claim 9, wherein the timing circuit comprises:
   an integer divider configured to:
      receive the combination of the first signal and the second signal; and
      output the first output clock signal; and
   a fractional output divider configured to:
      receive the difference and the combination; and
      output the second output clock signal.

11. The apparatus of claim 9, wherein the timing circuit comprises a plurality of fractional output dividers, and each one of the plurality of fractional output dividers is configured to output a copy of the second output clock signal.

12. The apparatus of claim 9, wherein the timing circuit comprises a low pass filter configured to filter the second signal prior to the subtraction of the second signal from the third signal, where a bandwidth of the low pass filter is based on a bandwidth of the APLL.

13. The apparatus of claim 9, wherein the timing circuit comprises a scaler configured to scale the difference before generation of the second output clock signal.

14. The apparatus of claim 9, wherein the timing circuit comprises a frequency output divider, wherein frequency output divider comprises:
   a multi-modulus divider configured to receive the combination of the first signal and the second signal;
   a sigma-delta modulator configured to receive the difference combination of the first signal and the second signal; and
   a jitter reduction circuit configured to reduce jitter in the second output clock signal.

15. The apparatus of claim 9, wherein a difference between a bandwidth of the first DPLL and a bandwidth of the second DPLL is less than a predefined threshold.

16. The apparatus of claim 9, wherein the second output clock signal is independent from the first reference signal.

17. A method for operating a timing circuit to synchronize a plurality of networks, the method comprising:
   operating an analog phase-lock loop (APLL) to output a first signal;
   operating a first digital phase-lock loop (DPLL) to output a second signal;
   operating a second DPLL to output a third signal;
   combining the first signal and the second signal to generate a first output clock signal; and
   subtracting the second signal from the third signal to generate a second output clock signal, wherein the second output clock signal is independent from operations of the first DPLL.

18. The method of claim 17, further comprising:
   operating a plurality of fractional output dividers to output a plurality of copies of the second output clock signal.

19. The method of claim 17, further comprising operating a low pass filter to filter the second signal prior to subtracting of the second signal from the third signal, wherein a bandwidth of the low pass filter is based on a bandwidth of the APLL.

20. The method of claim 17, wherein a difference between a bandwidth of the first DPLL and a bandwidth of the second DPLL is less than a predefined threshold.

* * * * *